United States Patent [19]

Nakahata et al.

[11] Patent Number: 5,320,865
[45] Date of Patent: Jun. 14, 1994

[54] METHOD OF MANUFACTURING A SURFACE ACOUSTIC WAVE DEVICE

[75] Inventors: Hideaki Nakahata; Shinichi Shikata; Akihiro Hachigo; Naoji Fujimori, all of Hyogo, Japan

[73] Assignee: Sumitomo Electric Industries, Ltd., Osaka, Japan

[21] Appl. No.: 947,283

[22] Filed: Sep. 16, 1992

[30] Foreign Application Priority Data

Sep. 24, 1991 [JP] Japan .................. 3-292974

[51] Int. Cl.[5] ............................................ H01L 41/22
[52] U.S. Cl. ................... 427/100; 29/25.35; 310/313 R
[58] Field of Search ............... 29/25.35; 310/313 R, 310/313 A; 333/155; 427/100

[56] References Cited

U.S. PATENT DOCUMENTS 4,952,832  8/1990  Imai et al. .................. 310/313 A

FOREIGN PATENT DOCUMENTS 64-20714  1/1989  Japan .
64-62911  3/1989  Japan .
23197389  8/1991  Japan .

Primary Examiner—Carl E. Hall
Attorney, Agent, or Firm—W. G. Fasse; W. F. Fasse

[57] ABSTRACT

A method of manufacturing a surface acoustic wave device which has a smaller insertion loss and which operates at higher frequency than a conventional surface acoustic wave device is provided. The surface acoustic wave device includes a substrate, a diamond layer formed on the substrate, a piezoelectric layer formed on the diamond layer, and electrodes formed on any of the substrate, the diamond layer and the piezoelectric layer. The piezoelectric layer is formed by the laser ablation method. The insertion loss of this acoustic wave device is small even in a high frequency range of several hundreds MHz to GHz. Therefore, the device can be used as a frequency filter, a resonator, a delay line, a convolver, a correlator and the like.

16 Claims, 1 Drawing Sheet

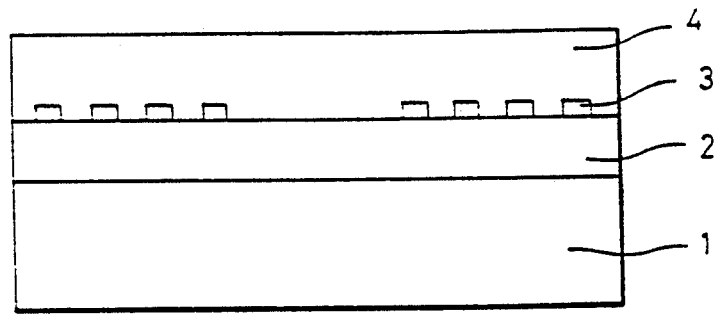
FIG.1
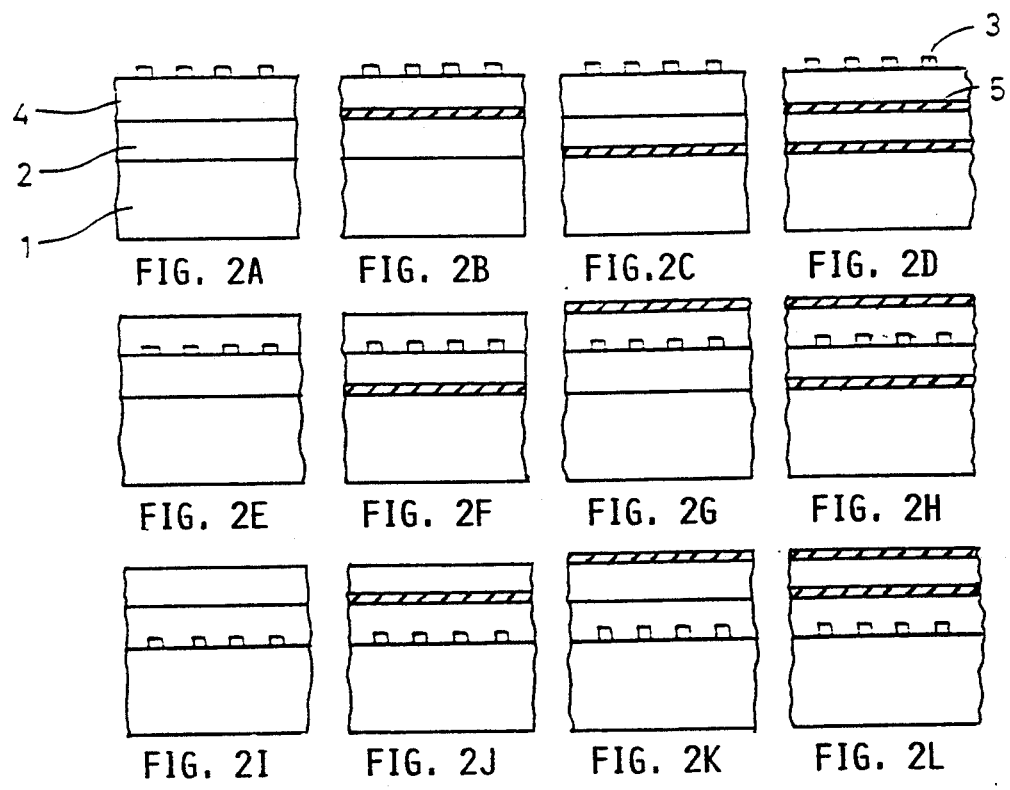
FIG. 2A  FIG. 2B  FIG. 2C  FIG. 2D
FIG. 2E  FIG. 2F  FIG. 2G  FIG. 2H
FIG. 2I  FIG. 2J  FIG. 2K  FIG. 2L

METHOD OF MANUFACTURING A SURFACE ACOUSTIC WAVE DEVICE

BACKGROUND OF THE INVENTION

1. Field of the Invention

The present invention relates to a method of manufacturing a surface acoustic wave device used in a high frequency range.

2. Background Information

A surface acoustic wave device propagates surface acoustic waves on the surface of a solid body on which energies are concentrated. Such a device can be miniaturized while still achieving a stable performance. Therefore, such a device is used, for example, as an intermediate frequency filter of a TV receiver or the like. The surface acoustic wave device includes interdigital electrodes provided on a piezoelectric layer. When an AC electric field is applied to the interdigital electrodes on the piezoelectric layer of the surface acoustic wave device having such a structure, strains opposing each other are generated between adjacent electrodes whereby the piezoelectric effect, and surface waves are excited. Bulk single crystal of quartz, LiNbO, LiTaO or the like, and a ZnO thin film vapor deposited on a substrate are used as the materials of the piezoelectric body.

The operation frequency f of the surface acoustic wave device is determined as $f = v/\lambda$ (v: phase velocity of the acoustic wave propagating along the surface of the solid body, $\lambda$: pitch of the interdigital electrodes). More specifically, the device can be used in a higher frequency range if the pitch $\lambda$ is smaller and the velocity v is larger. However, the velocity v of the surface acoustic wave is limited by the material characteristics of the solid body. Further, there are technical limits of fine processing the electrode width, for example, smallest possible width that can be processed by photolithography is 0.8 $\mu$m, while electronic beam exposure techniques enable processing in the order of submicrons. However, the yield becomes lower as the line width becomes thinner, so that there is a lower limit of the pitch of the interdigital electrodes. Accordingly, the highest possible operation frequency of surface acousting wave devices used in practice at present is 900 MHz.

A surface acoustic wave device which can be used in a higher frequency range (GHz range) is desirable, as communications at higher frequencies such as satellite communication and mobile communication have been developed. Diamond has the highest sound velocity among all materials known so far (the velocity of the transverse wave=13000 m/s, the velocity of the longitudinal wave=16000 m/s) and if diamond is used as a base material, the velocity of the surface acoustic wave can be made 10000 m/s or higher. A diamond-like carbon film has a similar sound velocity as diamond, and the velocity v of the surface acoustic wave can be increased to the same extent when a diamond-like carbon film is used as the base material.

Surface acoustic wave devices having a stacked structure of diamond and a piezoelectric body are disclosed, for example, in Japanese Patent Laying-Open Nos. 64-20714, and 64-62911, and the development of such devices has been promoted.

The nature of the piezoelectric layer largely affects the characteristics of the surface acoustic wave device. A specific example of a surface acoustic wave device formed by providing a ZnO film, which is a piezoelectric material, on diamond will be described. Conventionally, the ZnO film has been formed on the diamond by a high frequency sputtering method. In a surface acoustic wave device, the efficiency of excitation of the surface acoustic waves and the propagation loss of the waves are influenced by the c-axis orientation, grain size, surface flatness, resistivity and adhesiveness of the film on the diamond substrate.

If the c-axis orientation of the formed ZnO film is not sufficient, the piezoelectric nature of the ZnO film is not fully exhibited, and the surface acoustic waves are not excited. The smaller $\sigma$ value of the film in accordance with the X-ray rocking curve analysis of the c-axis orientation is the more preferable. The value must be within 5 degrees, in order to use the device as a surface acoustic wave device. Generally, the $\sigma$ value of the ZnO film formed on the diamond substrate by RF sputtering method is in the range of 2 to 3 degrees.

The smaller the grain size of the formed ZnO film is, the better the surface flatness, and the smaller becomes the propagation loss of the surface acoustic waves when the surface is more flat. If the propagation loss is too large, the total loss in the device becomes too large, and the device cannot be practically used. To obtain useful devices the surface of the film should be as flat as possible. The ZnO film formed on the diamond substrate by RF sputtering having a $\sigma$ value of about 2 to 3 degrees would have a film thickness of 1 $\mu$m and a grain size of 50 nm, and the corresponding surface roughness is up to about several tens nm.

The piezoelectric film must have a high resistivity to excite the surface acoustic waves. The composition ratio of Zn and O of the ZnO film formed by the RF sputtering method is not 1:1 but an excess of Zn is present. Accordingly, the film turns to be an n type semiconductor, which is conductive. In order to make sure that this film has the required high resistivity, Li has been doped into the ZnO during sputtering to compensate for the charges and to increase the resistivity of the film. The resistivity of the c-axis oriented ZnO film doped with Li during RF sputtering can generally be adjusted at about $10^6$ $\Omega$.cm.

As described above, the ZnO polycrystalline film having a superior c-axis orientation formed on a diamond layer by the conventional RF sputtering method has a film thickness of 1 $\mu$m and the grain size of the film is about 50 nm. Further, since the ZnO film is doped with Li impurities to provide a higher resistivity, the film has imperfect crystallinity. Therefore, when the surface acoustic wave device is fabricated by using the ZnO film formed by the RF sputtering method, the propagation loss of the surface acoustic waves becomes substantial about 70 dB/cm at 1 GHz. This causes a large insertion loss between the input and output of the device, which leads to a limited application of these devices in practice. The problem of the large propagation loss becomes even more troublesome as the frequency at which the device it is used becomes higher.

SUMMARY OF THE INVENTION

It is an object of the present invention to provide a method of manufacturing a surface acoustic wave device that has a small insertion loss in a high frequency operating range.

According to one aspect, the present invention provides a method of manufacturing a surface acoustic wave device including a substrate, a diamond layer formed on the substrate, a piezoelectric layer formed on the diamond layer, and electrodes formed on any of the substrate, the diamond layer and the piezoelectric layer, in which the piezoelectric layer is formed by a laser ablation method.

According to another aspect, the present invention provides a method of manufacturing a surface acoustic wave device including the steps of forming a diamond layer on a substrate, forming electrodes on the diamond layer, and forming a piezoelectric layer by the laser ablation method on the diamond layer and on the electrodes.

The temperature of the stacked body including the substrate and the diamond layer during formation of the piezoelectric layer by the laser ablation method, is preferably in the range of 150° C. to 500° C., and more preferably in the range of 200° C. to 350° C.

The film forming gas atmosphere in which the piezoelectric layer is being formed by the laser ablation method should preferably be oxygen.

The pressure of the film forming gas atmosphere when the piezoelectric layer is being formed by the laser ablation method is preferably in the range of $1 \times 10^{-3}$ Pa to $5 \times 10^{-1}$ Pa, and more preferably in the range of $5 \times 10^{-3}$ Pa to $1 \times 10^{-1}$ Pa.

In the present invention, the piezoelectric layer is mainly composed of at least one compound selected from the group consisting of ZnO, AlN, Pb (Zr, Ti)$O_3$, (Pb, La) (Zr, Ti)$O_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS.

The laser ablation method is a method for forming a film on a substrate in which a pulse laser is focused to irradiated a target thereby generating ions, atoms, and clusters. Such a method is described in, e.g., Solid State Technology / February 1989, pp. 106-110. According to the present invention, by using the laser ablation method for forming the ZnO film on the diamond substrate, a ZnO film is produced having the following characteristics: a superior c-axis orientation and a smaller grain size of 10 nm with a film thickness of 1 μm, a superior surface flatness with a surface roughness of 10 nm at the most and a resistivity as high as about $10^6$ Ω.cm. Such a resistivity can be attained without doping Li which was necessary in the conventional RF sputtering method.

The film forming conditions when the piezoelectric layer is formed by the laser ablation method are as follows.

An Excimer laser, YAG laser, CO$_2$ laser or the like is preferred to provide the laser beam. A preferred target includes a sintered ceramics of ZnO and other Zn compounds.

Oxygen is preferred as the gas atmosphere in which the film formation takes place. Inert gas such as Ar, or CO$_2$ may possibly be used instead of oxygen. However, when the resistivities of the resulting ZnO films are compared, a ZnO film having a superior insulation of about $10^6$ to $10^{10}$ Ω.cm can be provided when oxygen is used, while ZnO film having a poor insulation quality of about $10^4$ to $10^6$ Ω.cm results if the latter gases are used. If N$_2$ is used as the gas atmosphere, the resistivity of the resulting ZnO film is about $10^2$ to $10^4$ Ω.cm which is too low to be used as the surface acoustic wave device.

A ZnO film having a superior orientation and surface flatness can be provided if the pressure of the film forming gas atmosphere is within the range of $1 \times 10^{-3}$ Pa to $5 \times 10^{-1}$ Pa. A more preferable pressure range is $5 \times 10^{-3}$ Pa to $1 \times 10^{-1}$ Pa since such pressure range provides a ZnO film having good uniformity expressed as a film thickness distribution <10%.

The temperature of the stacked body including the substrate and the diamond layer should preferably be in the range from 150° C. to 500° C. If the temperature is lower than 150° C., the ZnO film would have an inferior orientation ($\sigma$ value >4°), and if the temperature is higher than 500° C., the ZnO film would have a large grain size causing a larger surface roughness of more than 30 nm. More preferably, the temperature should be within the range of 200° C. to 350° C., which provides a ZnO film having a superior orientation of $\sigma < 3°$ and a superior flatness with a surface roughness <20 nm.

The stacked structure of the ZnO film and diamond has the advantage that the propagation loss of the surface acoustic wave can be made small e.g. 20 dB/cm at 1 GHz. By using the laser ablation method under the above described conditions for forming the ZnO film, a surface acoustic wave device has been fabricated that has a smaller insertion loss than a respective device made by the conventional RF sputtering method.

Accordingly, the surface acoustic wave device manufactured by the present invention can be used as a frequency filter, a resonator, a delay line, a convolver, a correlator or the like, since the insertion loss in the range of several hundreds of MHz to GHz is small.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view showing a structure of a surface acoustic wave device in accordance with one embodiment of the present invention.

FIGS. 2A to 2L show side views of various arrangements of the electrodes of the surface acoustic wave device in accordance with another embodiment of the present invention.

DESCRIPTION OF THE PREFERRED EMBODIMENTS

A surface acoustic wave filter having the structure shown in FIG. 1 was fabricated. A polycrystalline diamond layer 2 was formed by a microwave plasma CVD method with H$_2$ and CH$_4$ used as a material gas on a Si substrate 1. After surface grinding, two pairs (for input and output) of Al interdigital electrodes 3 (line width: 2 μm, pitch: 600 μm, number of pairs: 50 pairs, propagation distance: 500 μm) were formed. A ZnO film 4 having the thickness of 1 μm was formed thereon by the laser ablation method. The conditions for the ZnO film formation were as follows: substrate temperature: 300° C., laser used: excimer laser, laser intensity: 2 J/cm$^2$, film forming atmosphere: oxygen $4 \times 10^{-2}$ Pa, target material: ZnO ceramics.

The c-axis orientation of the ZnO film was as good as $\sigma = 1.0$ degree, the grain size was 10 nm, the surface flatness was several to 10 nm and the resistivity was $10^6$ Ω.cm. The frequency characteristic of the surface acoustic wave filter formed in this manner was measured. The characteristic of the bandpass filter with the surface acoustic wave of the primary mode corresponds to the characteristic of the bandpass filter with a central frequency of 1 Ghz, and an insertion loss at the central frequency was 10 dB.

EXAMPLE FOR COMPARISON

A ZnO film was formed by the RF sputtering method and a surface acoustic wave filter having the similar structure as the above described embodiment was fabricated. The conditions of sputtering were: RF power: 150 W, gas Ar50%, oxygen 50%, pressure: 1.3 Pa, substrate temperature: 300° C., target material: ceramics of ZnO+1% of $Li_2CO_3$. The c-axis orientation of the ZnO film was $\sigma=2.5$ degrees, grain size was 50 nm, surface flatness was up to 30 nm, and the resistivity was $10^6$ $\Omega$.cm. As to the frequency characteristics of the surface acoustic wave filter, the central frequency was 1 GHz and the insertion loss was 25 dB In the embodiment of the surface acoustic wave device manufactured in accordance with the present invention, counter electrodes may be provided for enlarging the propagation velocity of the surface acoustic waves propagating on the stacked structure and to enlarge the electromechanical coupling coefficient. FIGS. 2A to 2L show side views partly in section illustrating various electrode arrangements. The effects of the present invention can be obtained in any of the surface acoustic wave devices having the electrode arrangements shown in FIGS. 2A to 2L.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a surface acoustic wave device including a substrate, a diamond layer formed on the substrate, and a piezo-electric layer formed on the diamond layer, comprising the following steps:
    (a) forming said piezoelectric layer by a laser ablation method, and
    (b) forming electrodes (3) on any of said substrate, said diamond layer, and said piezoelectric layer.

2. The method of claim 1, comprising: maintaining the temperature of said substrate and of said diamond layer within the range of 150° C. to 500° C. when said piezoelectric layer is being formed by said laser ablation method.

3. The method of claim 1, comprising maintaining the temperature of said substrate and said diamond layer within the range of 200° C. to 350° C. when the piezoelectric layer is being formed by said laser ablation method.

4. The method of claim 1, comprising performing said laser ablation method in an oxygen atmosphere.

5. The method of claim 1, comprising performing said laser ablation method in a gas atmosphere at a gas pressure within the range of $1\times10^{-3}$ Pa to $5\times10^{-1}$ Pa.

6. The method of claim 1, comprising performing said laser ablation method in a gas atmosphere at a gas pressure within the range of $5\times10^{-3}$ Pa to $1\times10^{-1}$ Pa.

7. The method of claim 1, comprising performing said laser ablation method while maintaining said substrate and said diamond layer at a temperature within the range of 150° C. to 500° C., and further performing said laser ablation method in an oxygen gas atmosphere at a gas pressure within the range of $1\times10^{-3}$ Pa to $5\times10^{-1}$ Pa.

8. The method of claim 1, wherein said piezoelectric layer is mainly composed of at least one component selected from the group consisting of ZnO, AlN, Pb (Zr, Ti)$O_3$, (Pb, La) (Zr, Ti)$O_3$, $LiTaO_3$, $LiNbO_3$, $SiO_2$, $Ta_2O_5$, $Nb_2O_5$, BeO, $Li_2B_4O_7$, $KNbO_3$ZnS, ZnSe and CdS.

9. A method of manufacturing a surface acoustic wave device comprising the following steps: forming a diamond layer on a substrate; forming electrodes on said diamond layer; and forming a piezoelectric layer on said diamond layer and on said electrodes by a laser ablation method.

10. The method of claim 9, further comprising maintaining a temperature of said substrate and of said diamond layer when said piezoelectric layer is being formed by the laser ablation method within the range of 150° C. to 500° C.

11. The method of claim 10, wherein said temperature is maintained within the range of 200° C. to 350° C.

12. The method of claim 9, comprising performing said laser ablation method in an oxygen gas atmosphere.

13. The method of claim 9, comprising performing said laser ablation method in a gas atmosphere at a pressure within the range of $1\times10^{-3}$ Pa to $5\times10^{-1}$ Pa.

14. The method of claim 13, wherein said pressure is within the range of $5\times10^{-3}$ Pa to $1\times10^{-1}$ Pa.

15. The method of claim 9, comprising performing said laser ablation method while maintaining said substrate and said diamond layer at a temperature within the range of 150° C. to 500° C., and further performing said laser ablation method in an oxygen gas atmosphere at a pressure within the range of $1\times10^{-3}$ Pa to $5\times10^{-1}$ Pa.

16. The method of claim 9, wherein said piezoelectric layer is mainly composed of at least one component selected from the group consisting of ZnO, AlN, Pb (Zr, Ti)$O_3$, (Pb, La) (Zr, Ti)$O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe and CdS.

* * * * *

UNITED STATES PATENT AND TRADEMARK OFFICE
CERTIFICATE OF CORRECTION

PATENT NO. : 5,320,865
DATED : June 14, 1994
INVENTOR(S) : Hideaki Nakahata; Shinichi Shikata; Akihiro Hachigo; Naoji Fujimori It is certified that error appears in the above-indentified patent and that said Letters Patent is hereby corrected as shown below:

On the title page:
In [30] replace "3-292974" by --3-242974--.

Col. 3, line 56, replace "$CO_2$may" by --$CO_2$ may--.

Signed and Sealed this

Fourth Day of October, 1994

Attest:

BRUCE LEHMAN

Attesting Officer

Commissioner of Patents and Trademarks